(12) United States Patent
Goto et al.

(10) Patent No.: US 9,683,829 B2
(45) Date of Patent: Jun. 20, 2017

(54) POSITION DETECTION DEVICE

(71) Applicant: AMITEQ CO., LTD., Tokyo (JP)

(72) Inventors: Atsutoshi Goto, Tokyo (JP); Daisuke Goto, Tokyo (JP); Kazuya Sakamoto, Tokyo (JP); Hiroshi Sakamoto, Saitama (JP); Yasuhiro Yuasa, Tokyo (JP)

(73) Assignee: AMITEQ CO., LTD., Tokyo (JP)

( * ) Notice: Subject to any disclaimer, the term of this patent is extended or adjusted under 35 U.S.C. 154(b) by 186 days.

(21) Appl. No.: 14/364,610

(22) PCT Filed: Dec. 13, 2012

(86) PCT No.: PCT/JP2012/082426
§ 371 (c)(1),
(2) Date: Jun. 11, 2014

(87) PCT Pub. No.: WO2013/089205
PCT Pub. Date: Jun. 20, 2013

(65) Prior Publication Data
US 2014/0347075 A1 Nov. 27, 2014

(30) Foreign Application Priority Data

Dec. 13, 2011 (JP) ................. 2011-272818
Jun. 20, 2012 (JP) ................. 2012-139212

(51) Int. Cl.
*G01R 27/26* (2006.01)
*G01B 7/00* (2006.01)
(Continued)

(52) U.S. Cl.
CPC .......... *G01B 7/003* (2013.01); *G01D 5/2216* (2013.01); *G01D 5/243* (2013.01); *G01R 27/2611* (2013.01)

(58) Field of Classification Search
CPC .. G01R 27/26; G01R 27/2611; G01D 5/2216; G01D 5/243; G01B 7/003
(Continued)

(56) References Cited

U.S. PATENT DOCUMENTS 3,704,415 A * 11/1972 Yamanaka ............. G01R 17/06
324/117 R
5,353,906 A * 10/1994 Takamisawa ............ G07D 5/08
194/319
(Continued)

FOREIGN PATENT DOCUMENTS

EP 1 600 739 A1 11/2005
JP S57 103012 A 6/1982
(Continued)

OTHER PUBLICATIONS

Partial European Search Report dated Apr. 13, 2015 for EP12856907.6 received in related PCT application No. PCT/JP2012/082426.
(Continued)

*Primary Examiner* — Hoai-An D Nguyen
(74) *Attorney, Agent, or Firm* — Blank Rome LLP

(57) ABSTRACT

A detection coil incorporated in a self-oscillation circuit, which includes the coil and a capacitor and is set to a high frequency band (e.g., around 1 MHz or higher). A target section has a relative position to the coil section that varies in response to displacement of a detection object and includes a magnetism-responsive member constructed to cause inductance of the coil to vary with the relative position. A rectifier circuit extracts an amplitude level of an oscillation output signal of the self-oscillation circuit and outputs the extracted level as detected position data. For example, a plurality of self-oscillation circuits are provided. Alternatively, a single self-oscillation circuit forms a plurality of series circuits by, for each coil pair, connecting in
(Continued)

series the two coils of the coil pair, and connecting the series circuits in parallel as an inductor element for self-oscillation.

20 Claims, 7 Drawing Sheets

(51) Int. Cl.
*G01D 5/243* (2006.01)
*G01D 5/22* (2006.01)

(58) Field of Classification Search
USPC ............... 324/652, 649, 600; 73/1.23, 1.79; 310/12.19; 340/489, 991, 992, 993
See application file for complete search history.

(56) References Cited

U.S. PATENT DOCUMENTS

| 2001/0052771 | A1* | 12/2001 | Jagiella | F15B 15/2846 324/207.16 |
|---|---|---|---|---|
| 2005/0040815 | A1* | 2/2005 | Jagiella | F15B 15/2892 324/207.15 |
| 2006/0132120 | A1 | 6/2006 | Luber | |
| 2010/0085039 | A1* | 4/2010 | Goto | G01D 5/2013 324/207.18 |
| 2010/0177537 | A1* | 7/2010 | Kitamura | H02M 3/3385 363/21.02 |
| 2011/0304345 | A1* | 12/2011 | Hrubes | G01D 1/00 324/629 |
| 2014/0125422 | A1* | 5/2014 | Koyama | H03B 5/362 331/116 R |

FOREIGN PATENT DOCUMENTS

| JP | 10-197493 | A | 7/1998 |
|---|---|---|---|
| JP | 2001-004309 | A | 1/2001 |
| JP | 2004-301774 | A | 10/2004 |
| JP | 2004301774 | A | 10/2004 |
| JP | 2005-300199 | A | 10/2005 |
| JP | 2005300199 | A | 10/2005 |
| WO | 00/36427 | A1 | 6/2000 |
| WO | 2005-086767 | A2 | 9/2005 |
| WO | 2007/000952 | A1 | 1/2007 |
| WO | 2010-069284 | A2 | 6/2010 |

OTHER PUBLICATIONS

International Search Report regarding corresponding PCT Application No. PCT/JP2012/082426, dated Jan. 15, 2013.
Written Opinion and European Search Report in counterpart EP Appl. 12856907.6, dated Jul. 29, 2015.
Office Action in counterpart Chinese Appl. 2012800617782.2, dated Feb. 16, 2016.
Examination Report in counterpart EP Appl. 12856907.6, dated Jul. 28, 2016, 5-pgs.
Office Action in counterpart Japanese Appl. 2012-558120, dated Dec. 6, 2016, 8-pgs.

* cited by examiner

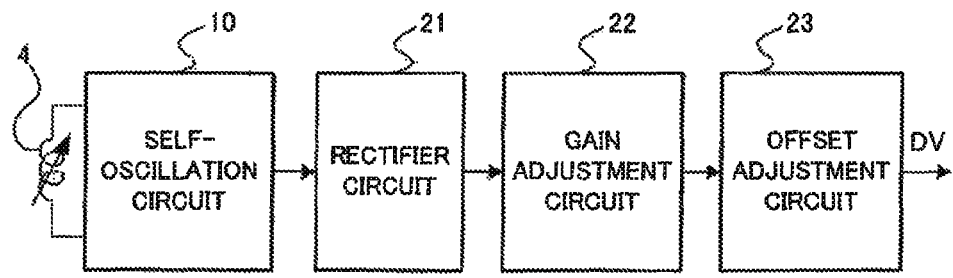
F I G. 1
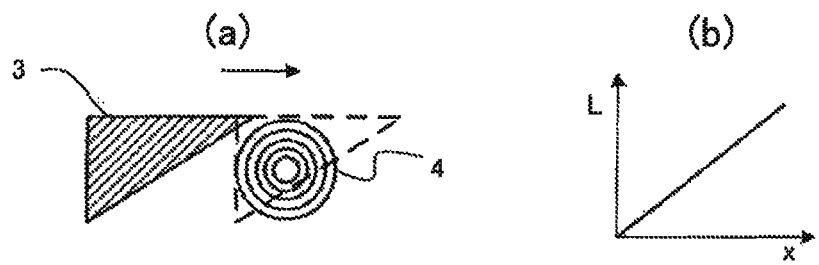
F I G. 2
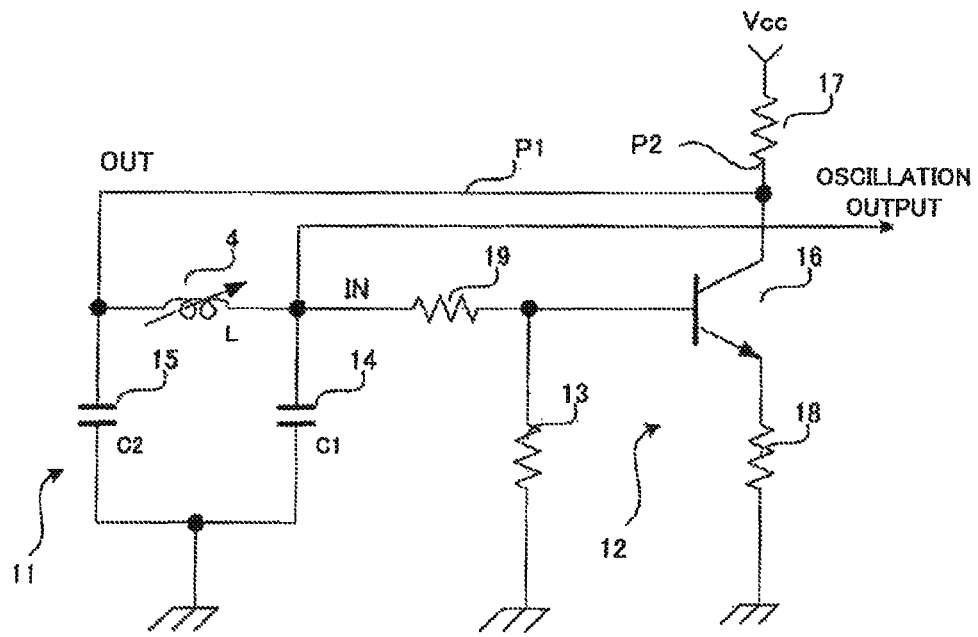
F I G. 3

POSITION DETECTION DEVICE

TECHNICAL FIELD

The present invention relates to a position detection device of a type which has a coil, functioning as a detection element, incorporated as an inductance element of a self-oscillation circuit. The present invention relates also to a position detection device which has a flat coil, formed in a swirling shape on a printed circuit board and functioning as a detection element, incorporated as an inductance element of a self-oscillation circuit, and which is applicable to various desired types of position detection, such as a minute displacement detection device, a linear position detection device, a rotational position detection device, an inclined position detection device, etc.

BACKGROUND ART

Heretofore, there have been known various types of position detection devices which employ a coil (inductance element) as a detection element. Many of such position detection devices include an AC signal source dedicated to energization of the coil, so that the coil is AC-energized by an AC signal generated from the AC signal source being applied to the coil. Also known are proximity sensors which could eliminate the need for a dedicated energizing AC signal source by use of the principle of the LC oscillation circuit, i.e. by incorporating a coil, functioning as a detection element, in a self-oscillation circuit as an inductance element (see, for example, Patent Literature 1). Such self-oscillation type proximity sensors are advantageous in that they can be significantly reduced in size because the need for providing a dedicated energizing AC signal source can be eliminated. However, because the conventionally-known, self-oscillation type proximity sensors are constructed to detect a variation in oscillation frequency corresponding to proximity of an object of detection or detection object, they require a frequency discrimination circuit. Further, although the conventionally-known, self-oscillation type proximity sensors are constructed to be suited for detection of a variation in oscillation frequency, they are not constructed to be capable of detecting a position of an object of detection on the basis of an amplitude level of an oscillation output signal.

If the challenge to reduction in size of the device construction is considered from another perspective, there can be employed an approach of using, as the detection element, a flat coil formed in a swirling shape on a printed circuit board, one example of which is disclosed in Patent Literature 2. In position detection devices using such a flat coil, the number of winding turns in one coil is so small that it is difficult to obtain a sufficient magnetic flux for detection of a detection object. To make up for such an insufficient magnetic flux, the device disclosed in Patent Literature 2 employs a technique of providing the flat coil in multiple layers.

PRIOR ART LITERATURE

Patent Literature 1: Japanese Patent Application Laid-open Publication No. HE-10-173437
Patent Literature 2: Japanese Patent Application Laid-open Publication No. 2010-122012

SUMMARY OF INVENTION

In view of the foregoing prior art problems, it is a primary object of the present invention to promote simplification and size reduction of an overall construction of a position detection device using a coli as a detection element. A main approach for accomplishing this object is to allow a self-oscillation-type position detection device, which has a coil, functioning as a detection element, incorporated as an inductance element of a self-oscillation circuit, to detect a position of a detection object on the basis of an amplitude level of an oscillation output signal. Thus, this approach permits position detection based on simple amplitude level discrimination rather than based on frequency discrimination. An additional approach for accomplishing the abovementioned object is to employ a construction even further simplified by using, as a detection element, a flat coil formed in a swirling shape on a printed circuit board and, in such a case, supplement a magnetic flux that tends to become insufficient.

A position detection device of the present invention comprises: a coil section including at least one coil; a target section whose relative position to the coil section varies in response to a position of a detection object, the target section including a magnetism-responsive member constructed to cause inductance of the coil included in the coil section to vary in accordance with the relative position; a self-oscillation circuit comprising the coil included in the coil section and a capacitor, the self-oscillation circuit having the coil, included in the coil section, incorporated therein as an inductance element for self-oscillation; and an output circuit that extracts an amplitude level of an oscillation output signal of the self-oscillation circuit and outputs the extracted amplitude level as position data of the detection object.

In the past, a variation of inductance L in a self-oscillation circuit (or variation of capacitor's capacitance) was considered only in terms of a variation of a resonant frequency. However, through observations by the inventors of the present invention and the like, it has been found that a variation of the inductance L in the self-oscillation circuit can be detected as an amplitude variation of the oscillation output signal by appropriately selecting capacitance C such that, in a resonant frequency band, oscillation occurs in a region in the neighborhood of a great Q characteristic (i.e., peak of amplitude or gain) where an attenuation rate is high and then observing an oscillation amplitude signal for that region.

Further, if the oscillation frequency of the self-oscillation circuit is set in a high frequency band (e.g., in the neighborhood of 1 (one) MHz), it is possible to increase a possible variation width (dynamic range) of an amplitude level of a DC voltage signal obtained by rectification of the oscillation output signal. In this way, the present invention can achieve position detection based on simple amplitude level discrimination using a rectifier circuit etc. rather than based on frequency discrimination.

As an example, the coil may comprise a flat coil formed in a swirling shape on a printed circuit board. Namely, because the present invention can provide an increased output gain, the present invention can be even further simplified in construction but also advantageously supplement a magnetic flux that tends to become insufficient, by using, as a detection element, the flat coil formed in a swirling shape on the printed circuit board.

According to another aspect of the present invention, there is provided a position detection device, which comprises: a coil section including a plurality of coils; a target section whose relative position to the coil section varies in response to a position of a detection object, the target section including a magnetism-responsive member constructed to cause respective inductance of the coils included in the coil section to vary in accordance with the relative position, the target section being constructed in such a manner that a variation characteristic of the inductance responsive to the position of the detection object differs between at least two or more of the coils; and a plurality of self-oscillation circuits comprising the coils included in the coil section and capacitors, each of the self-oscillation circuits having at least one of the plurality of coils, included in the coil section, incorporated therein as an inductance element for self-oscillation, a plurality of position detection signals of different characteristics being output on the basis of a plurality of oscillation output signals of the plurality of self-oscillation circuits. Thus, in the position detection device using the oscillation circuits, the present invention can advantageously output a plurality of position detection signals of different characteristics (e.g., four resolver-type output signals +sin θ sin ωt, −sin θ sin ωt, +cos θ sin ωt, and −cos θ sin ωt.

According to still another aspect of the present invention, there is provided a position detection device comprising: a coil section including a plurality of pairs of coils; a target section whose relative position to the coil section varies depending on a position of a detection object, the target section including a magnetism-responsive member constructed to cause respective inductance of the coils included in the coil section to vary in accordance with the relative position; a self-oscillation circuit comprising the coils included in the coil section and capacitors, the self-oscillation circuit forming a plurality of series circuits by connecting, for each of the pairs, two coils, constituting the pair, in series with each other to thereby provide a plurality of series circuits and connecting the series circuits in parallel with each other, the self-oscillation circuit having the series circuits, connected in parallel, incorporated therein as an inductance element for self-oscillation, a plurality of oscillation output signals taken out from respective connection points of the pairs of coils being output as a plurality of position detection signals of different characteristics. Thus, the present invention can achieve the superior advantageous benefit that it can generate a plurality of position detection signals of different characteristics using only one self-oscillation circuit.

BRIEF DESCRIPTION OF DRAWINGS

FIG. 1 is a circuit diagram showing an example circuit construction of a position detection device according to an embodiment of the present invention;

FIG. 2 is a schematic diagram showing example relationship between a coil and a target section in the embodiment of the position detection device of the present invention;

FIG. 3 is a circuit diagram showing an example of a self-oscillation circuit having a position detecting coil incorporated therein as an inductance element;

DESCRIPTION OF EMBODIMENTS

Figure 4:
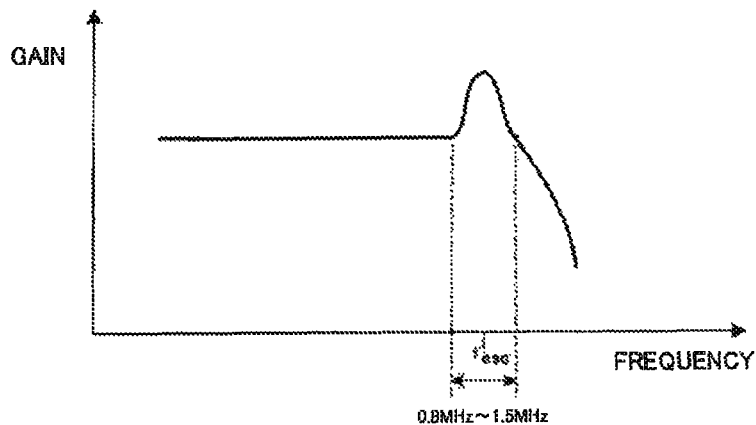
FIG. 4 is a diagram showing an example of a resonant characteristic in the self-oscillation circuit.

As shown in FIG. 1, a coil section (coil 4), which is one of position detection elements in an embodiment of a position detection device of the present invention, is incorporated in a self-oscillation circuit 10 as a variable inductance element, and this coil section is energized by self oscillation. In the instant embodiment, the coil section comprises a single coil 4. Namely, the coil section does not include any particular (dedicated) AC oscillation source or need not be supplied with an energizing AC signal from an external source, and thus, a circuit construction can be simplified to a considerable degree. The coil 4 is, for example, in the form of a flat coil formed in a swirling shape on a printed circuit board, and such a flat coil contributes to reduction in size of a constriction of the position detection device. In this case, the flat coil 4 may comprise a plurality of flat coil portions disposed in multiple layers and connected in series with one another. Such a multi-layer coil structure can achieve an increased inductance. Note that the coil 4 may comprise a winding type coil rather than the flat coil.

As illustratively shown in FIG. 2(*a*), the embodiment of the position detection device includes, as another position detection element, a target section 3 disposed in such a manner that, in response to displacement of a not-shown target or object of detection (i.e., detection object), it moves (is displaced) and thus its relative position to the coil 4 changes. Further, the target section 3 comprises a magnetism-responsive member shaped in such a manner as to change the inductance of the coil 4 in accordance with its relative position (the "magnetism-responsive member" is a term defining, in the broadest sense of the term, material, such as magnetic material or electrically conductive material, that varies in reluctance/magnetic resistance in response to magnetism, i.e. magnetic flux. As an example, the magnetism-responsive member forming the target section 3 is made of ferromagnetic material, such as iron. Further, the magnetism-responsive member forming the target section 3 may be of any desired shape as along as at least one of an area of a portion of the target section 3 opposed to the coil 4 and a gap between the target section 3 and the coil 4 varies in response to a variation in the relative position of the coil 4 to the target section 3. Note that the present invention is applicable to any forms of motion or movement of the detection object, such as linear displacement, rotational displacement, swing displacement and inclination. Further, the target section 3 may be of any shape and mechanical constitution or construction conventionally known in the field of induction-type or variable reluctance-type position detection devices.

FIG. 2(b) is a graph showing an example of a variation of the inductance L of the coil 4 responsive to the relative position x of the target section 3 to the coil 4. Although this figure shows an example where the variation of the inductance L of the coil 4 is of a linear characteristic, the present invention is not so limited, and the variation of the inductance L of the coil 4 may be of a non-linear characteristic (such as a sine characteristic or cosine characteristic).

FIG. 3 shows an example of the self-oscillation circuit 10 in which the coil 4 is incorporated as an inductance element. The self-oscillation circuit 10 is a Colpitts oscillator circuit comprising a parallel LC circuit 11 and an amplifier 12. The parallel LC circuit 11 comprises the aforementioned coil 4 functioning as a variable inductance whose inductance L varies in response to movement or displacement of the detection object, and capacitors 14 and 15. The amplifier 12 includes a transistor 16 as an amplification element, a source-collector resistor 17, an emitter-ground resistor 18, and base-voltage setting resistors 19 and 13. Note that the amplification element is not limited to a transistor and may be another desired inverted amplification element, such as an FET or operational amplifier. A signal at a connection point between one of the capacitors 14 of the parallel LC circuit 11 and the coil 4 is input to an input terminal (base input) IN, and a signal of an output terminal (collector output) OUT of the amplifier 12 is input to a connection point between the other capacitor 15 of the parallel LC circuit 11 and the coil 4. In the illustrated example, the oscillation output signal is taken out from the input terminal (base input) IN of the amplifier 12. The oscillation output signal varies in its frequency and amplitude level in response to a variation of the inductance L of the coil 4. Thus, the oscillation output signal of the self-oscillation circuit 10 is equivalent to a position detection output signal based on the coil 4. Note that the basic construction of the self-oscillation circuit 10 is not limited to the Colpitts oscillator circuit as shown and described above and may be a Harley oscillator circuit.

Preferably, for temperature characteristic compensation of the detecting coil 4 and temperature characteristic compensation of the oscillation circuit, an appropriate temperature compensation element is provided in the oscillation circuit (FIG. 3) (for example, such an appropriate temperature compensation element may be inserted in a pathway of the base-voltage setting resistor 19 or 13 of the inverted amplifier 12). As the most effective temperature characteristic compensation, it is conceivable to employ a method in which an arithmetic circuit, such as a MCU, performs a differential arithmetic operation between two signals of two position detection devices as will be described later in relation to FIG. 5.

Let it be assumed here that a resonant frequency of the self-oscillation circuit 10 is set in a high frequency band. Setting the resonant frequency of the self-oscillation circuit 10 in a high frequency band like this is advantageous in that a sufficiently high gain can be gained when the oscillation output has been converted by a rectifier circuit into a DC voltage. Particularly, in the case where the flat coil formed on the printed circuit board is employed as the detecting inductance element, securing a high gain by setting the resonant frequency in a relatively high frequency band acts extremely advantageously because the number of wining turns cannot be increased.

As known in the art, the resonant frequency $f_{osc}$ of the Colpitts oscillator circuit is defined as $$f_{osc} \sim = 1/2\pi \sqrt{\{L*(C1*C2)/C1+C2\}},$$

and thus, the inductance L and constants of capacitances C1 and C2 may be set such that the resonant frequency $f_{osc}$ is set in a desired high frequency band (in the neighborhood of a strong peak characteristic Q where the gain changes steeply). FIG. 4 shows an example of an oscillation characteristic in which a strong peak characteristic Q of the oscillation circuit 10 where the gain changes steeply is present in the neighborhood of the resonant frequency $f_{osc}$. For example, if the constants of the capacitances C1 and C2 and the inductance L of the coil 4 in a steady state (e.g., zero-displacement state) are set at such values as to obtain the desired resonant frequency $f_{osc}$, and if the oscillation circuit is designed such that a band where the amplitude of the resonant frequency $f_{osc}$ varies in response to a variation of the inductance L of the coil 4 over an entire displacement range of the detection object becomes a region corresponding to the neighborhood of the peak characteristic Q, then the instant embodiment can provide a detection signal, where the amplitude of the oscillation output signal of the self-oscillation circuit 10 corresponds to a variation of the inductance L, making use of a band corresponding to the steep peak characteristic Q.

Referring now back to FIG. 1, the oscillation output signal of the self-oscillation circuit 10 is input to a rectifier circuit 21 where it is converted into a DC voltage corresponding to its amplitude level. The output signal of the rectifier circuit 21 is adjusted in gain by a gain adjustment circuit 22 and then supplied to an offset adjustment circuit 23 where the signal is offset-adjusted by a desired offset voltage being added to or subtracted from the signal, so that a position detecting DC voltage signal DV is provided. These rectifier circuit 21, gain adjustment circuit 22, offset adjustment circuit 23, etc. together constitute an output circuit that extracts an amplitude level of the oscillation output signal of the self-oscillation circuit 10 and outputs the extracted amplitude level as position data of the detection object. As an example, the position detecting DC voltage signal DV has a linear characteristic as shown in FIG. 2(b). As another example, the position detecting DC voltage signal DV has a desired non-linear characteristic (such as a sine or cosine characteristic). Such a position detecting DC voltage signal DV can be used directly as an analog signal, or used after being converted into a digital value.

Two or more sets of the detection circuitry shown in FIG. 1 may be provided in parallel so that the individual sets of the detection circuitry can provide detection output signals of different characteristics in response to displacement of the same detection object. For example, the first set of detection circuitry may be constructed to generate a detection signal of an amplitude characteristic gradually increasing in response to a variation of a position of the detection object, while the second set of detection circuitry may be constructed to generate a detection signal of an amplitude characteristic gradually decreasing in response to the variation of the position of the detection object. Alternatively, the first set of detection circuitry may be constructed to generate a detection signal of an amplitude characteristic varying in a sine function in response to a variation of a position of the detection object, while the second set of detection circuitry may be constructed to generate a detection signal of an amplitude characteristic varying in a cosine function in response to the variation of the position of the detection object. In such cases, the resonant frequency may be set to differ between the individual sets of detection circuitry. Thus, detection outputs (oscillation outputs) can be provided which are not be influenced by magnetic interference or mutual inductance between the coils of the individual sets of detection circuitry. As a consequence, adverse influences of magnetic interference or mutual inductance can be advantageously eliminated with ease.

Figure 5:
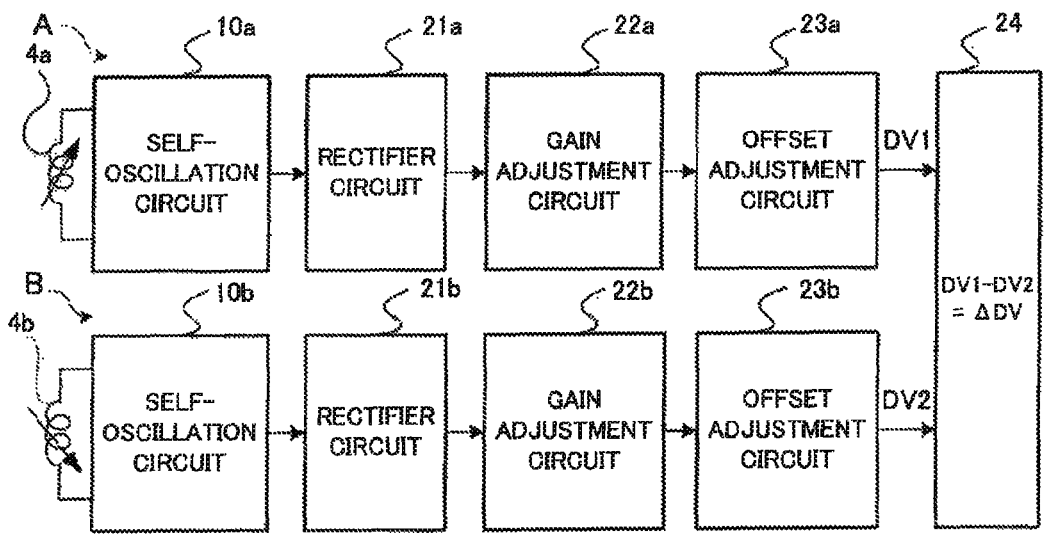
FIG. 5 is a diagram showing a position detection system where two position detection devices as shown in FIG. 1 are provided with opposite characteristics so as to make temperature characteristic compensation.
Figure 6:
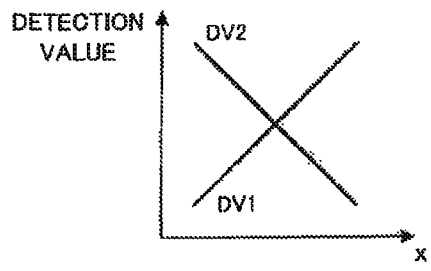
FIG. 6 is a diagram showing an example of characteristics of detection values in the two position detection devices of the position detection system shown in FIG. 5.

FIG. 5 shows an example of a system which includes two sets of detection circuitry A and B are provided in parallel and in which a difference ΔDV between position detection signals DV1 and DV2 of the two sets of detection circuitry A and B is calculated by means of an arithmetic unit 24 to thereby provide temperature-characteristic-compensated position detection data ΔDV. In FIG. 5, the detecting coils 4a and 4b, self-oscillation circuits 10a and 10b, rectifier circuits 21a and 21b, gain adjustment circuits 22a and 22b and offset circuits 23a and 23b, constituting the two sets of detection circuitry A and B, have the same functions as the components of the same names shown in FIG. 1. However, let it be assumed that the respective target sections 3 in the two sets of detection circuitry A and B are constructed to present opposite characteristic patterns such that the two sets of detection circuitry A and B generate position detection signals DV1 and DV2 with different characteristics (differential characteristics). For example, as shown in FIG. 6, the first set A generates a position detection signal DV1 of an amplitude characteristic gradually increasing in response to a variation of a position of the detection object, while the second group B generates a position detection signal DV2 of an amplitude characteristic gradually decreasing in response to the same variation of the position of the detection object. A difference ΔDV between the position detection signals DV1 and DV2 of opposite (differential) characteristics indicates the position of the detection object. Further, because error variation components α depending on temperature characteristics included in the two position detection signals DV1 and DV2 logically present an identical value, the error variation components α are removed from the difference ΔV through a differential arithmetic operation, so that the difference ΔV becomes accurate temperature-characteristic-compensated position detection data. Note that the arithmetic unit 24 may perform arithmetic operations either in a digital manner or in an analog manner.

Figure 7:
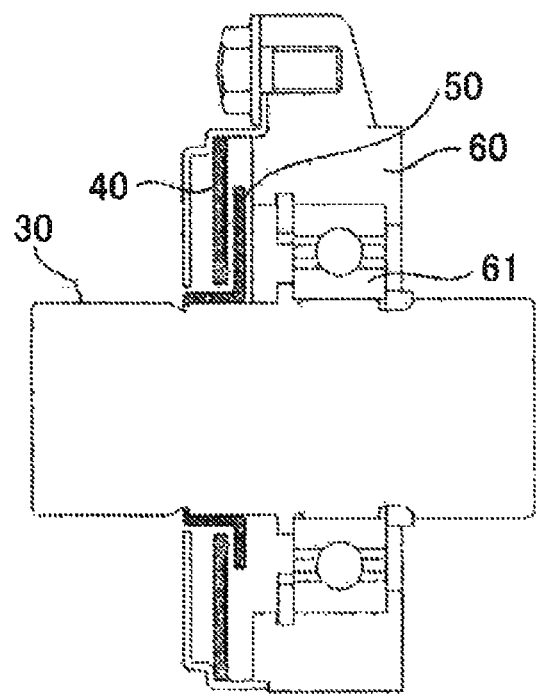
FIG. 7 is an axial cross-sectional view showing an example of the position detection device of the present invention constructed as a rotational position detection device.
Figure 8:
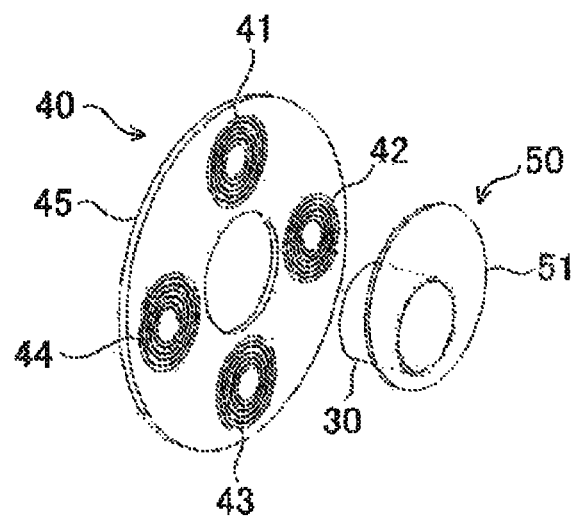
FIG. 8 is an exploded perspective view showing examples of a stator section and a rotor section in FIG. 7.

FIG. 7 is an axial cross-sectional view showing an example of the position detection device of the present invention constructed as a rotational position detection device. A rotor section 50 is fixedly mounted on a rotation shaft 30 to which is given rotational displacement of the detection object, and a stator section 40 is fixed to a base section 60. The rotation shaft 30 is mounted to the base section 60 via a rotational bearing 61. FIG. 8 is an exploded perspective view showing examples of the stator section 40 and the rotor section 50.

The stator section 40 comprises a coil section fixedly provided therein, and the coil section includes four coils 41 to 44 disposed at equal intervals (90° mechanical angular intervals) along a circumferential direction of the stator section 40. Each of the coils 41 to 44 is, for example, in the form of a flat coil provided on a printed circuit board 45. The rotor section (rotary type target section) 50 is constructed to rotationally move relative to the stator section 40 in response to displacement of the position of the detection object. The rotor section (rotational type target section) 50 is constructed of a magnetism-responsive member 51 of a predetermined shape, such as an eccentric disk shape, mounted on the rotation shaft 30 to which is applied rotational movement as a detection object. Although it is assumed, for convenience of description, that the magnetism-responsive member 51 is formed of magnetic material, such as iron, the present invention is not so limited, and the magnetism-responsive member 51 may be formed of non-magnetic and electrically conductive material (such as copper or aluminum).

As an example, the stator section 40 (circuit board 45) is disposed opposed to the rotor section 50 in a thrust direction, as shown in FIGS. 7 and 8. In this case, the individual coils 41 to 44 are disposed in such a manner that magnetic fluxes passing through the coils are oriented in the axial direction of the rotation shaft 30. A gap is formed between the end surfaces of the coils 41 to 44 provided on the circuit board 45 and a surface of the magnetism-responsive member 51 of the rotor section 50, and thus, the rotor section 50 rotates relative to the stator section 40 in a non-contact fashion. Relative positions of the rotor section 50 and the stator section 40 are set so that the gap or distance between the rotor section 50 and the stator section 40 is maintained constant. Because the magnetism-responsive member 51 of the rotor section 50 has the predetermined shape, such as an eccentric disk shape, the end surface area of the coils opposed to the magnetism-responsive member 51 via the gap varies in accordance with a rotational position of the magnetism-responsive member 51 of the rotor section 50. In response to such a variation in area between the rotor section 50 and the stator section 40 due to rotation of the rotor section 50, an amount of the magnetic fluxes passing through the individual coils varies, so that the inductance of the coils 41 to 44 varies.

Because of the eccentric disk shape of the magnetism-responsive member 51 of the rotor section 50, the inductance variation of the coils 41 to 44 occurs at a rate of one cycle per rotation of the rotation shaft 30. By properly designing the material, shape and other suitable factors of the magnetism-responsive member 51 of the rotor section 50, the rotor section 50 can be designed properly so that a cyclic characteristic of the inductance variation of the coils 41 to 44 presents an ideal or approximative triangular functional characteristic.

If the cyclic characteristic of the inductance variation of a certain one of the coils 41 is a plus (+) sine functional characteristic, the cyclic characteristics of the inductance variation of the other coils 42 to 44 sequentially arranged at the 90° mechanical angular intervals can be expressed as follows:

$$A(\theta)=P_0+P \sin \theta \quad \text{(coil 41);}$$

$$B(\theta)=P_0+P \cos \theta \quad \text{(coil 42);}$$

$$C(\theta)=P_0-P \sin \theta \quad \text{(coil 43); and}$$

$$D(\theta)=P_0-P \cos \theta \quad \text{(coil 44),}$$

where $P_0$ indicates a center of the swing of the inductance variation, P indicates an amplitude of the swing. Because P may be regarded as "1" and omitted without involving any inconvenience, it will be omitted from the following description.

According to the present invention, the coils 41 to 44 in the coil section are combined to constitute a plurality of pairs each comprising two coils. The two coils constituting each one of the pairs are set such that respective inductance variations of the two coils present characteristics of mutually opposite phase characteristics in response to a position (rotational position) of the detection object. More specifically, the coil 41 of the +sine characteristic (plus sine phase) and the coil 43 of the −sine characteristic (minus sine phase)

constitute one pair, while the coil 42 of the +cosine characteristic (plus cosine phase) and the coil 44 of the −cosine characteristic (minus cosine phase) constitute the other pair.

Figure 9:
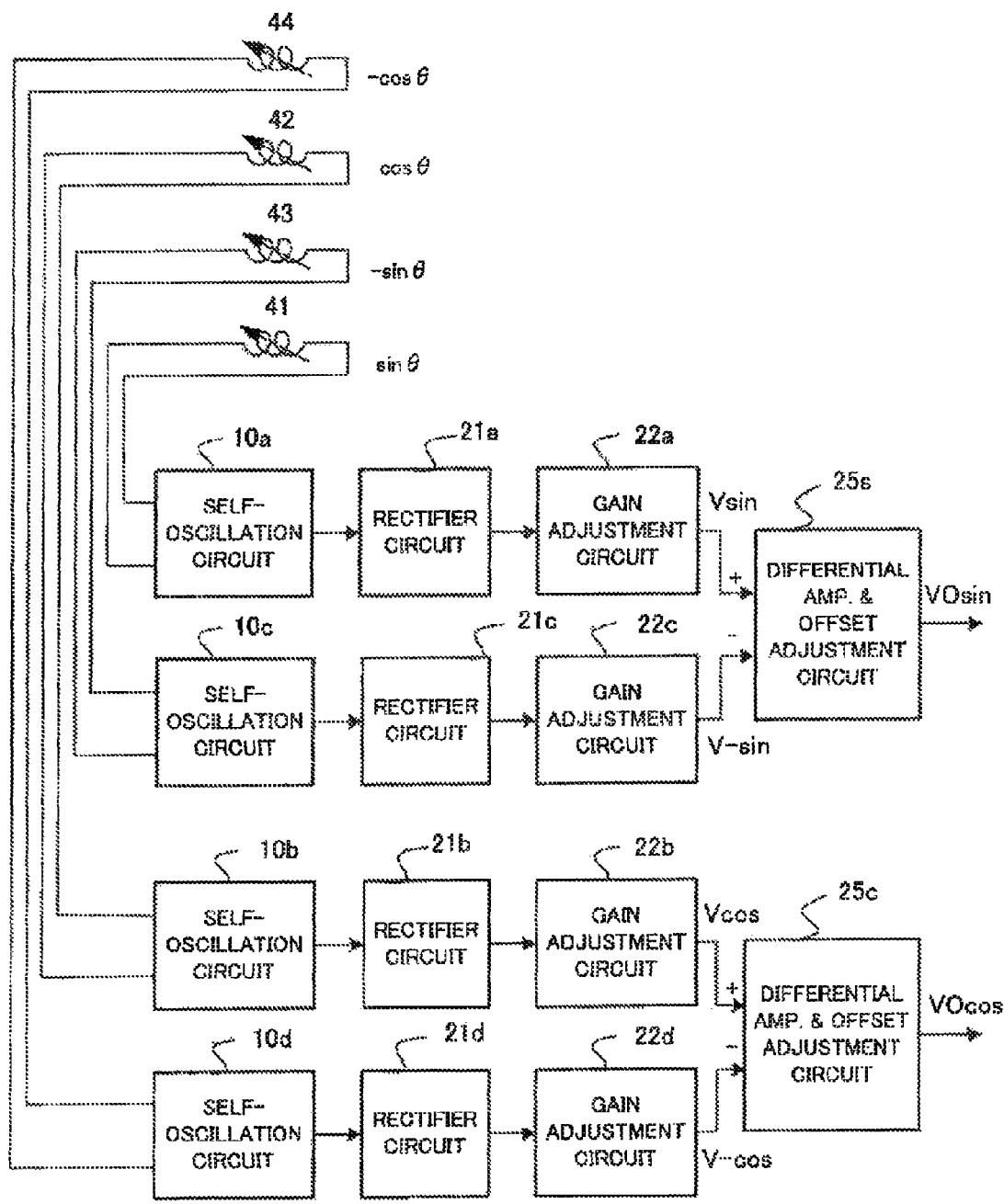
FIG. 9 is a block diagram showing an example detection circuitry construction in the rotational position detection device.

FIG. 9 shows an example detection circuitry construction of the rotational position detection device having the four coils 41 to 44 as set forth above. Basically, it suffices that the rotational position detection device include: self-oscillation circuits 10a to 10d provided in corresponding relation to the coils 41 to 44; and groups of rectifier circuits 21a to 21d, gain adjustment circuits 22a to 22d and offset adjustment circuits provided in corresponding relation to the self-oscillation circuits 10a to 10d, in a similar manner to FIG. 5. Note, however, in the example of FIG. 9, the offset adjustment circuits are slightly different in construction from those shown in FIG. 5.

In FIG. 9, the coil 41 presenting the sin θ inductance variation characteristic is incorporated in the self-oscillation circuit 10a as an inductance element therefor. The self-oscillation circuit 10a is similar in construction to the self-oscillation circuit 10 shown in FIG. 3, except that the coil 41 is incorporated therein in place of the coil 11. The oscillation output signal of the self-oscillation circuit 10a has a characteristic of +sin θ sin ωt responsive to a detection object's rotational position θ. Here, ω represents an angular frequency of self-oscillation of the self-oscillation circuit 10a. The oscillation output signal of the self-oscillation circuit 10a is input to the rectifier circuit 21a, where it is converted into a DC voltage corresponding to an amplitude level of the output signal. An output signal of the rectifier circuit 21a is adjusted in gain in the gain adjustment circuit 22a and then input to the differential amplification and offset adjustment circuit 25s.

The coil 43 presenting the −sin θ inductance variation characteristic is incorporated in the self-oscillation circuit 10c as an inductance element therefor. The self-oscillation circuit 10c too is similar in construction to the self-oscillation circuit 10 shown in FIG. 3, except that the coil 43 is incorporated therein in place of the coil 11. The oscillation output signal of the self-oscillation circuit 10c has a characteristic of −sin θ sin ωt responsive to the detection object's rotational position θ. Here, ω represents an angular frequency of self-oscillation of the self-oscillation circuit 10c. The oscillation output signal of the self-oscillation circuit 10c is input to the rectifier circuit 21c, where it is converted into a DC voltage corresponding to an amplitude level of the output signal. An output signal of the rectifier circuit 21a is adjusted in gain in the gain adjustment circuit 22c and then input to the differential amplification and offset adjustment circuit 25s.

The differential amplification and offset adjustment circuit 25s performs a differential amplification operation for calculating a difference between an output of the gain adjustment circuit 22a and an output of the gain adjustment circuit 22c, makes adjustment of a result of the differential amplification operation by adding (or subtracting) a desired offset voltage to (or from) the result of the differential amplification operation, and thereby outputs a detection signal VO sin indicating an amplitude voltage of a sine function characteristic sin θ in response to a detection object's angle θ. This detection signal VO sin is temperature-characteristic-compensated data, similarly to the output of the arithmetic unit 24 shown in FIG. 5.

Further, the coil 42 presenting the cos θ inductance variation characteristic is incorporated in the self-oscillation circuit 10b as an inductance element therefor. The self-oscillation circuit 10b too is similar in construction to the self-oscillation circuit 10 shown in FIG. 3, except that the coil 42 is incorporated therein in place of the coil 11. The oscillation output signal of the self-oscillation circuit 10b has a characteristic of +cos θ sin ωt responsive to the detection object's rotational position θ. Here, ω represents an angular frequency of self-oscillation of the self-oscillation circuit 10b. The oscillation output signal of the self-oscillation circuit 10b is input to the rectifier circuit 21b, where it is converted into a DC voltage corresponding to an amplitude level of the output signal. An output signal of the rectifier circuit 21b is adjusted in gain in the gain adjustment circuit 22b and then input to the differential amplification and offset adjustment circuit 25c.

The coil 44 presenting the −cos θ inductance variation characteristic is incorporated in the self-oscillation circuit 10d as an inductance element therefor. The self-oscillation circuit 10d too is similar in construction to the self-oscillation circuit 10 shown in FIG. 3, except that the coil 44 is incorporated therein in place of the coil 11. The oscillation output signal of the self-oscillation circuit 10d has a characteristic of −cos θ sin ωt responsive to the detection object's rotational position θ. Here, ω represents an angular frequency of self-oscillation of the self-oscillation circuit 10d. The oscillation output signal of the self-oscillation circuit 10d is input to the rectifier circuit 21d, where it is converted into a DC voltage corresponding to an amplitude level of the output signal. An output signal of the rectifier circuit 21d is adjusted in gain in the gain adjustment circuit 22d and then input to the differential amplification and offset adjustment circuit 25c.

The differential amplification and offset adjustment circuit 25c performs a differential amplification operation for calculating a difference between an output of the gain adjustment circuit 22b and an output of the gain adjustment circuit 22d, makes adjustment of a result of the differential amplification operation by adding (or subtracting) a desired offset voltage to (or from) the result of the differential amplification operation, and thereby outputs a detection signal VO cos indicating an amplitude voltage of a cosine function characteristic cos θ in response to the detection object's angle θ. This detection signal VO cos is temperature-characteristic-compensated data, similarly to the above-mentioned.

Namely, the rotational position detection device of FIG. 9 outputs two kinds of rotational position detection signals: the detection signal VO sin indicating the amplitude voltage of the sine function characteristic sin θ, and the detection signal VO cos indicating the amplitude voltage of the cosine function characteristic cos θ. In this way, the rotational position detection signal of FIG. 9 can output two kinds of detection signals of sine and cosine characteristics similar to detection signals based on a known resolver output. Note that at least one of the detection signals VO sin and VO cos may be used as rotational position detection data. Also note that the other circuit component parts than the coils shown in FIG. 9 may be disposed on another region on the circuit board 45; alternatively, the circuit board 45 may be composed of a plurality of boards, and the flat coils 41 to 44 may be disposed on one of the boards with the other circuit component parts disposed on the other board(s). Also note that different resonant frequencies may be set for the self-oscillation circuits 10a to 10d.

Note that the number of the coils (poles) disposed on the circumference is not limited to four and may be smaller or greater than four, such as two, three, six or eight. In such a case, the magnetism-responsive member 51 of the rotor section 50 is modified in shape as necessary, in accordance with the number of the coils and arranged angles, on the circumference, of the coils, so that desired inductance characteristics can be obtained from the individual coils.

Further, whereas the stator section 40 (circuit board 45) has been described as disposed opposed to the rotor section 50 in a thrust direction as shown in FIGS. 7 and 8, the stator section 40 (circuit board 45) may be disposed in any other suitable manner. For example, the stator section 40 (circuit board 45) may be disposed in such a manner that the coils 41 to 44 of the stator section 40 are opposed to the rotor section 50 in a radial direction.

The position detection device of the present invention can be constructed as an inclined position detection device by arranging the plurality of coils 41 to 44, provided in the above-described rotational position detection device, within a narrow range less than one rotation (e.g., 45' range) and constructing the magnetism-responsive member 51, which is a movable member, in such a manner as to be pivotable within the narrow range (e.g., 45' range). Namely, by displacing the magnetism-responsive member 51 in response to inclined displacement of a detection object, the inclined position detection device can provide inclination detection data (angle detection data) on the basis of self-oscillation outputs corresponding to the coils 41 to 44. In this case, the circuit board having the plurality of coils 41 to 44 provided thereon may be displaced in response to inclined displacement of the detection object with the magnetism-responsive member 51 kept fixed. Such an inclination position detection device may employ detection circuitry similar in construction to the detection circuitry shown in FIG. 9.

Figure 10:
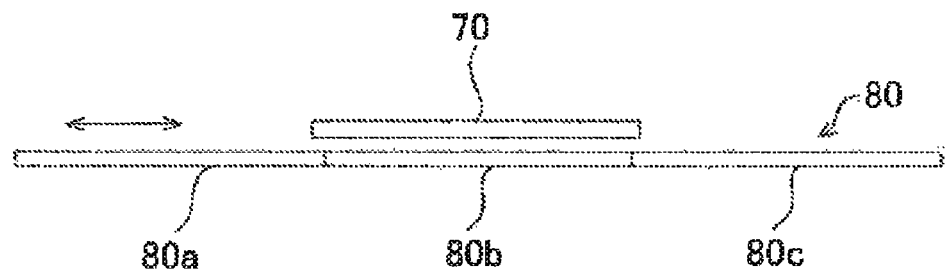
FIG. 10 is a schematic plan view showing an example of the position detection device of the present invention constructed as a linear position detection device.
Figure 11:
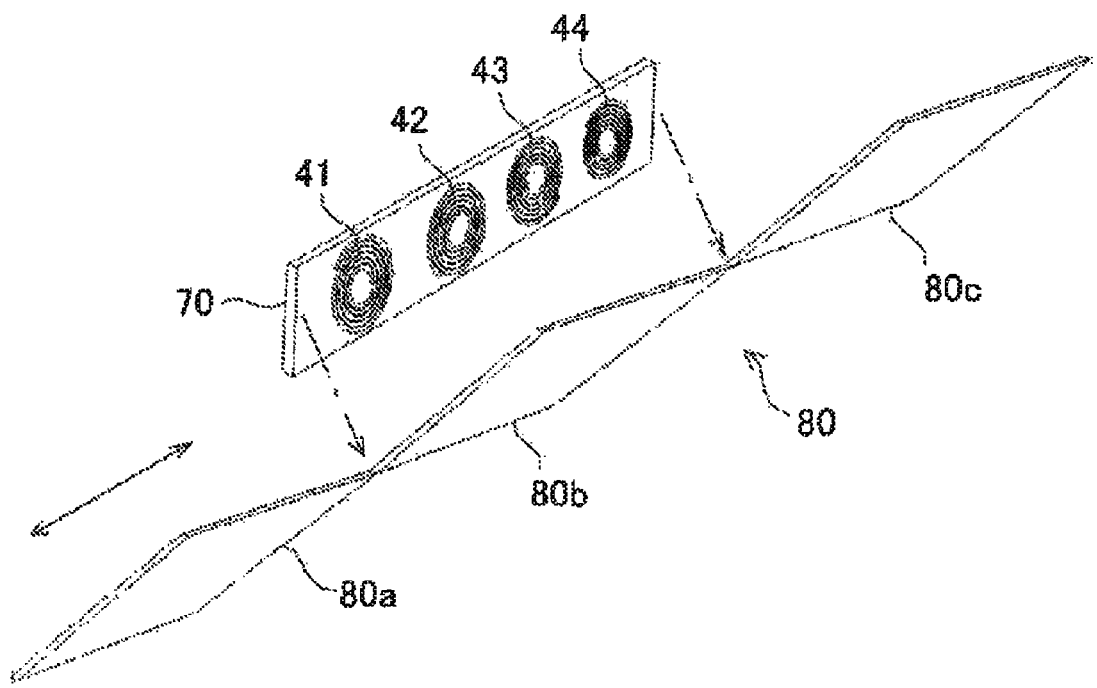
FIG. 11 is an exploded perspective view of the linear position detection device shown in FIG. 10.

FIG. 10 is a schematic plan view showing an example of the position detection device of the present invention constructed as a linear position detection device, and FIG. 11 is an exploded perspective view of the linear position detection device. This linear position detection device includes: a circuit board section 70 having a plurality of coils 41 to 44 (the same reference numerals 41 to 44 as used for the coils in the above-described rotational position detection device are used here for convenience of description); and a magnetism-responsive member (linear type target section) 80 shaped so as to cause inductance of the individual coils to vary along a linear displacement direction with predetermined characteristics. The magnetism-responsive member (linear type target section) 80 has variation patterns 80*a*, 80*b* and 80*c* arranged to repeat over a plurality of cycles along the linear displacement direction, and the magnetism-responsive member (linear type target section) 80 is fixed to a not-shown base section. In the circuit board section 70, the four coils 41 to 44 are arranged at equal intervals within a length range corresponding to one cycle length of one variation pattern (80*a*) of the magnetism-responsive member 80, and the four coils 41 to 44 linearly move in response linear displacement of a detection object. A gap is formed between the end surfaces of the coils 41 to 44 provided on the circuit board 70 and a pattern surface of the magnetism-responsive member 80, and thus, the circuit board 70 of the coil section is opposed to and linearly moves relative to the pattern of the magnetism-responsive member 80 of the base section in a non-contact fashion. Relative positions of the circuit board 70 of the coil section and the magnetism-responsive member 80 of the base section are set so that the gap or distance between the circuit board 70 and the magnetism-responsive member 80 is maintained constant. Because of a predetermined shape, such as a gradually increasing or decreasing shape (e.g., rhombic shape), of the one cycle of the variation patterns 80*a*, 80*b* and 80*c*, the end surface area of the coils opposed to the magnetism-responsive member 80 via the gap varies in response to a variation of the linear position of the detection object. In response to such a variation in the end surface area, an amount of magnetic fluxes passing through the individual coils 41 to 44 varies, so that the inductance of the coils 41 to 44 varies. Because the variation patterns 80*a*, 80*b* and 80*c* of the magnetism-responsive member 80 are arranged so as to repeat over a plurality of cycles along a linear displacement direction, the inductance of the individual coils 41 to 44 varies over one or more cycles in response to linear displacement of the detection object over one or more cycles. Needless to say, the magnetism-responsive member 80 may be displaced linearly in response to linear displacement of the detection object, and the circuit board 70 of the coil section may be fixed to the base section, conversely to the above-described.

Basically, the detection circuitry construction for the linear position detection device shown in FIGS. 10 and 11 may be similar to the detection circuitry construction shown in FIG. 9. Namely, the self-oscillation circuits 10*a* to 10*d* are provided in corresponding relation to the coils 41 to 44, the rectifier circuits 21*a* to 21*d* and gain adjustment circuits 22*a* to 22*d* are provided in corresponding relation to the self-oscillation circuits 10*a* to 10*d*, and the differential amplification and offset adjustment circuits 25*s* and 25*c* for outputting sine and cosine characteristic outputs are also provided.

Figure 12:
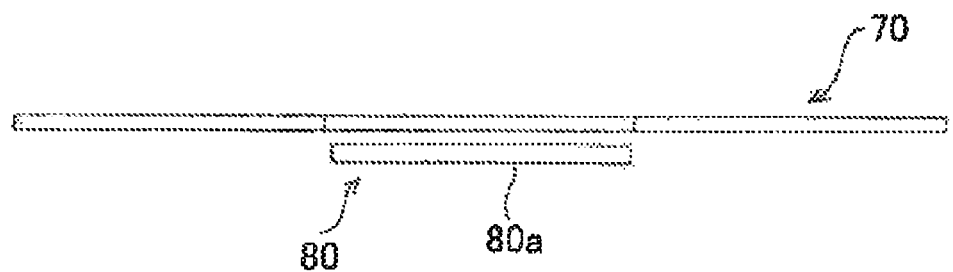
FIG. 12 is a schematic plan view showing another example construction of the linear position detection device of the present invention.
Figure 13:
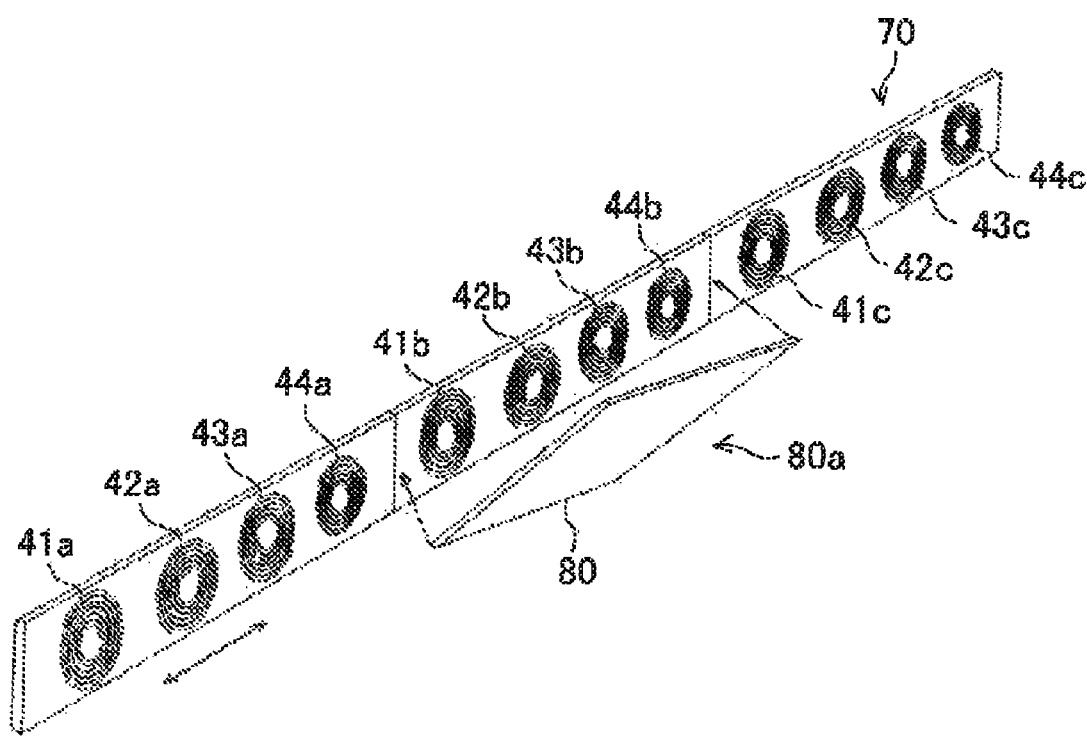
FIG. 13 is an exploded perspective view of the linear position detection device shown in FIG. 12.

FIG. 12 is a schematic plan view showing another example construction of the linear position detection device of the present invention, and FIG. 13 is an exploded perspective view of the example construction. In this example construction, the variation pattern 80*a* of the magnetism-responsive member 80 is provided for only one cycle, and the magnetism-responsive member 80 moves linearly in response to linear displacement of the detection object. The circuit board section 70 has a coil section disposed thereon along a linear displacement direction for a plurality of cycles each comprising four coils (41*a* to 44*a*, 41*b* to 44*b* and 41*c* to 44*c*).

Basically, the detection circuitry construction for the linear position device shown in FIGS. 12 and 13 may be similar to the detection circuitry construction shown in FIG. 9. However, of the coils 41*a* to 44*a*, 41*b* to 44*b* and 41*c* to 44*c*, the coils 41*a*, 41*b* and 41*c* of the same sine phase are connected in series with one another to replace the coil 41 of FIG. 9, the coils 42*a*, 42*b* and 42*c* of the same cosine phase are connected in series with one another to replace the coil 42 of FIG. 9, the coils 43*a*, 43*b* and 43*c* of the same minus sine phase are connected in series with one another to replace the coil 43 of FIG. 9, and the coils 44*a*, 44*b* and 44*c* of the same minus cosine phase are connected in series with one another to replace the coil 44 of FIG. 9. In this case too, the inductance of each coil group comprising the series-connected coils (41 to 44) varies over one or more cycles in response to linear displacement of the detection object over one or more cycles. Needless to say, the circuit board 70 of the coil section may be displaced linearly in response to linear displacement of the detection object, and the magnetism-responsive member 80 may be fixed to the base section, conversely to the above-described.

As a modification of the embodiments of FIGS. 5 and 9, only the self-oscillation circuits 10*a* to 10*d* may be provided, and a plurality of oscillation output signals of such self-oscillation circuits 10*a* to 10*d* may be output as a plurality of position detection signals of different characteristics. Such a modification can be summarized as a position detection device, which comprises: a coil section including a plurality of coils (4*a* and 4*b*, or 41 to 44); a target section (40 or 80) whose relative position to the coil section varies in response to a position of a detection object, and which includes a magnetism-responsive member (40 or 80) constructed to cause respective inductance of the coils included in the coil section to vary in accordance with the relative position, the target section (40 or 80) being constructed in such a manner that a variation characteristic of the inductance responsive to the position of the detection object differs between at least two or more of the coils; and a plurality of self-oscillation circuits (10a and 10b, or 10a to 10d) which comprise the coils included in the coil section and capacitors, each of the self-oscillation circuits having at least one of the plurality of coils incorporated therein as an inductance element for self-oscillation, so that a plurality of position detection signals of different characteristics are output on the basis of a plurality of oscillation output signals of the plurality of self-oscillation circuits. Such modified arrangements can achieve the advantageous benefit that the position detection device using the self-oscillation circuits can output a plurality of position detection signals of different characteristics (such as four resolver-type output signals, +sin θ sin ωt, −sin θ sin ωt, +cos θ sin ωt, and −cos θ sin ωt).

Figure 14:
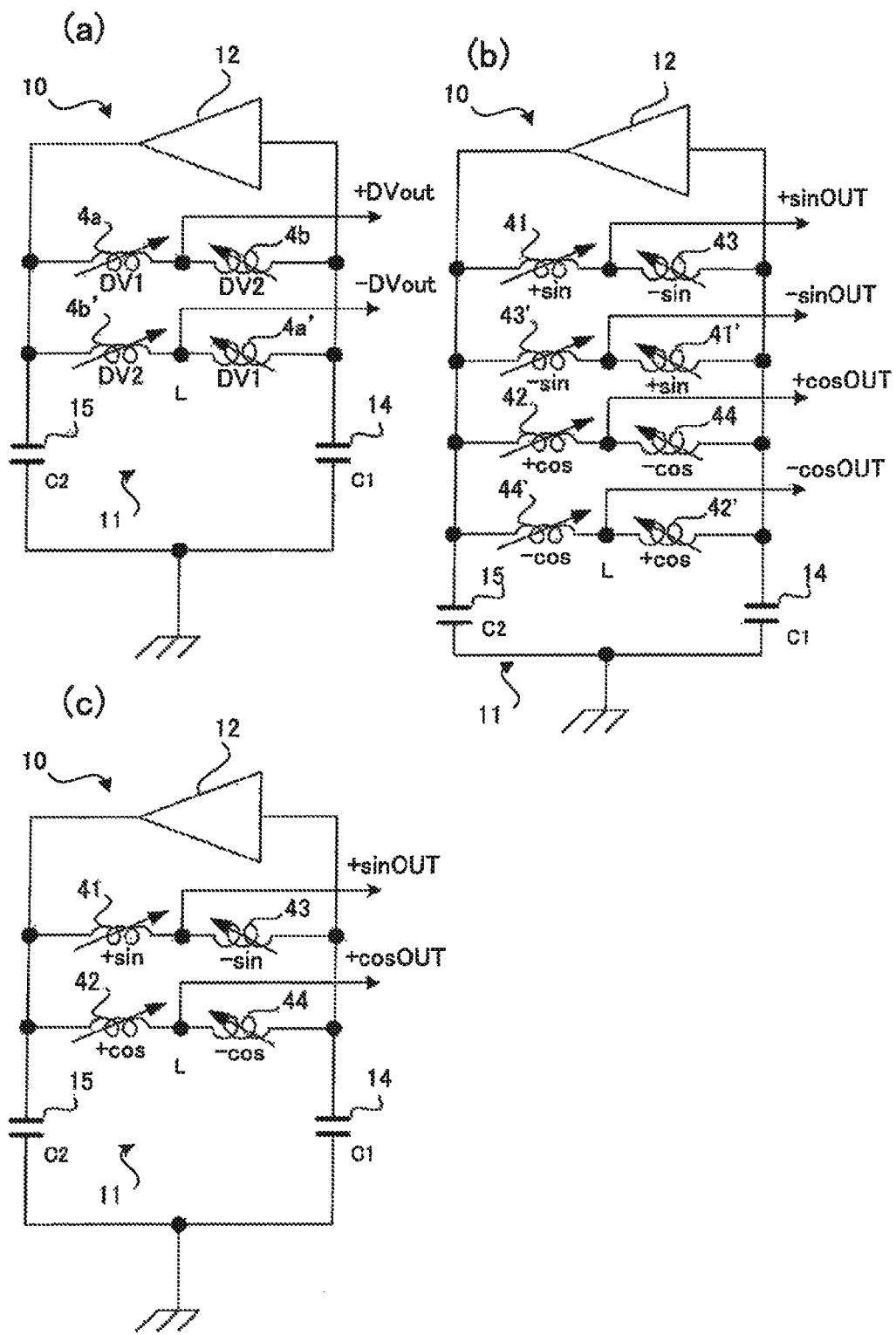
FIG. 14 is a circuit diagram showing other examples of detection circuitry for the position detection device of the present invention.

Each of the above-described embodiments includes the plurality of self-oscillation circuits 10a, 10b, . . . in order to provide a plurality of detection signals presenting different output characteristics with respect to a same position of the detection object. Such arrangements can achieve the advantageous benefit that the oscillation frequency can be made different among the plurality sets of detection circuitry. However, the present invention is not so limited and can be modified to use only one self-oscillation circuit 10 to provide a plurality of detection signals presenting different output characteristics. Such a modification can advantageously simplify the self-oscillating circuit construction. FIG. 14 shows some examples of such a simplified self-oscillating circuit construction.

FIG. 14(a) shows an example of the self-oscillation circuit 10 which can replace the self-oscillation circuits 10a and 10b of FIG. 5. In this case, the coil section in the position detection device is constructed to include not only one pair of coils 4a and 4b (first coil pair) but also another pair of coils 4a' and 4b' (second coil pair). For the first coil pair 4a and 4b, the coils 4a and 4b are arranged and the target section 3 is constructed in such a manner that, if one of the coils 4a presents an inductance variation characteristic corresponding to DV1 responsive to a position x of a detection object, the other coil 4b presents an inductance variation characteristic corresponding to DV2 that is opposite to DV1 (see FIG. 6). For the second coil pair 4a' and 4b' too, the coils 4a' and 4b' are arranged and the target section 3 is constructed in such a manner that the same characteristics as the first coil pair 4a and 4b can be obtained. Namely, the inductance variation characteristic of the coil 4a' responsive to the position x of the detection object is exactly the same as the inductance variation characteristic of the coil 4a, while the inductance variation characteristic of the coil 4b' responsive to the position x of the detection object is exactly the same as the inductance variation characteristic of the coil 4b. Thus, in the second coil pair 4a' and 4b', if the coil 4a presents an inductance variation characteristic corresponding to DV1 responsive to the position x of the detection object, the other coil 4b presents an opposite inductance variation characteristic corresponding to DV2 that is opposite to DV1'. Namely, in this example, the coil pairs presenting the same opposite inductance variation characteristics are provided doubly or in a twofold manner. Note that details of the amplifier 12 in the self-oscillation circuit 10 may be the same as those shown in FIG. 3 and hence will not be described here to avoid unnecessary duplication.

In FIG. 14(a), the self-oscillation circuit 10 includes two coils 4a and 4b connected in series with each other to constitute a first coil pair 4a and 4b (i.e., first series circuit or first voltage-dividing circuit) and two coils 4a' and 4b' connected in series with each other to constitute a second coil pair 4a' and 4b' (i.e., second series circuit or second voltage-dividing circuit), and such first and second series circuits (or voltage-dividing circuits) are connected in parallel with each other and incorporated in a parallel LC circuit 11 as inductance elements of the self-oscillation circuit 10. Two oscillation output signals +DVout and −DVout of the self-oscillation circuit 10 are output from respective coil connection points (middle points or voltage-diving points) of the two series circuits.

Further, in FIG. 14(a), a level of the oscillation output signal output from the connection point of the coils 4a and 4b of the first series circuit can be regarded as a divided value of a voltage produced in portions of the two coils 4a and 4b in accordance with respective inductance of the coils 4a and 4b. A voltage drop component DV1 corresponding to the inductance of the coil 4a responsive to a position x of the detection object and a voltage drop component DV2 corresponding to the inductance of the coil 4b responsive to the position x of the detection object, which are of opposite characteristics, can be expressed using a function f(x) of the position x of the detection object as follows:

$$DV1 = P_0 + Pf(x)$$

$$DV2 = P_0 - Pf(x),$$

where $P_0$ represents s an initial value and P represents a coefficient that does not depend on the position x. Because P may be regarded as "1" and omitted without involving any inconvenience, it will be omitted from the following description.

A voltage dividing ratio between the coils 4a and 4b in the first series circuit is expressed as DV1/(DV1+DV2). Because a variable element Pf(x) is canceled out in the denominator (DV1+DV2) and thus the variable element +Pf(x) is left only on the numerator, a signal having a component of +Pf(x) as the variable element is provided ultimately. Namely, the oscillation output signal +DVout provided on the basis of the voltage-dividing value in the first coil pair 4a and 4b is a signal presenting an amplitude characteristic f(x) responsive to the position x of the detection object.

On the other hand, a voltage dividing ratio between the coils 4b' and 4a' in the second series circuit is expressed as DV2/(DV2+DV1). Because the variable element −Pf(x) is left only on the numerator, a signal having a component of −Pf(x) as the variable element is provided ultimately. Namely, the oscillation output signal −DVout provided on the basis of the voltage-dividing value in the second coil pair 4b' and 4a' is a signal presenting an amplitude characteristic −f(x) responsive to the position x of the detection object. In this example, the two oscillation output signals +DVout and −DVout present opposite characteristics responsive to the position x of the detection object.

Namely, in the illustrated example of FIG. 14(a), two oscillation output signals +DVout and −DVout presenting opposite characteristics responsive to a position x of the detection object can be provided by use of the only one self-oscillation circuit 10. These two oscillation output signals +DVout and −DVout are input respectively to the rectifier circuits 21a and 21b in the two sets of detection circuitry A and B shown in FIG. 5. Namely, to implement the construction shown in FIG. 14(a), the one self-oscillation circuit 10 shown in FIG. 14(a) is employed in place of the two self-oscillation circuits 10a and 10b shown in FIG. 5, and the first oscillation output signal +DVout of the self-oscillation circuit 10 is input to the rectifier circuit 21a while the second oscillation output signal −DVout of the self-oscillation circuit 10 is input to the rectifier circuit 21b. In this way, a temperature-characteristic-compensated detection signal can be provided through a differential arithmetic operation by the arithmetic unit 24. Note that the oscillation output signals +DVout and −DVout in FIG. 14(a) can be used as-is or directly for any desired applications as AC signals containing position detection amplitude information without being applied to the circuitry of FIG. 5.

FIG. 14(b) shows an example of the one self-oscillation circuit 10 which can replace the self-oscillation circuits 10a to 10d of FIG. 9. In this case, the coil section in the rotational position detection device (or linear position detection device or inclined position detection device) is constructed to include not only two pairs of coils 41 and 43 (first sine coil pair) and coils 42 and 44 (first cosine coil pair) but also other two pairs of coils 41' and 43' (second sine coil pair) and coils 42' and 44' (second cosine coil pair). As in the example illustrated in FIG. 14(a), the second sine coil pair 41' and 43' and the second cosine coil pair 42' and 44' present the same inductance variation characteristics as the first sine coil pair 41 and 43 and the first cosine coil pair 42 and 44. Further, as in the example illustrated in FIG. 14(a), the two coils in each of the coil pairs are constructed to present opposite inductance variation characteristics (e.g., opposite-phase characteristics, such as +sin θ and −sin ωt) in the example of FIG. 14(b).

Thus, cyclic characteristics of the inductance variations, responsive to a rotational position θ, of the coils 41' to 44' in the second coil pair are in the following relationship:

$$A'(\theta) = P_0 + P \sin \theta \quad \text{(coil \textbf{41'})}$$

$$B'(\theta) = P_0 + P \cos \theta \quad \text{(coil \textbf{42'})}$$

$$C'(\theta) = P_0 - P \sin \theta \quad \text{(coil \textbf{43'})}$$

$$D'(\theta) = P_0 - P \cos \theta \quad \text{(coil \textbf{44'})}$$

Namely, the coil pairs presenting the same sine and cosine inductance variation characteristics are provided doubly or in a twofold manner. As an example of such a construction for additionally providing the second coil pair, the construction of the stator section 40 shown in FIG. 7 may be modified to include, in addition to the circuit board 45 having the four coils 41 to 44 provided thereon, an additional circuit board similar in construction to the circuit board 45, and such an additional circuit board may be fixedly disposed opposite to the circuit board 45 via the rotor section 50. Such an additional circuit board has the four coils 41' to 44' provided therein in opposed relation to the rotor section 50 and in the same layout as the coils 41 to 44 provided on the circuit board 45. Thus, in response to rotational displacement of the magnetism-responsive member 51 of the single rotor section 50, specific inductance variations are produced in the individual coils of the first and second coil pairs provided on the two circuit boards (45) disposed on opposite sides of the rotor section 50.

In FIG. 14(b), the self-oscillation circuit 10 includes two coils 41 and 43 connected in series with each other to constitute a first sine coil pair 41 and 43 (i.e., first series circuit or first voltage-dividing circuit) and two coils 41' and 43' connected in series with each other, in an opposite order from the first series circuit, to constitute a second coil pair 41' and 43' (i.e., second series circuit or second voltage-dividing circuit), two coils 42 and 44 connected in series with each other to constitute a first cosine coil pair 42 and 44 (i.e., third series circuit or third voltage-dividing circuit) and two coils 42' and 44' connected in series with each other, in an opposite order from the third series circuit, to constitute a second cosine coil pair 42' and 44' (i.e., fourth series circuit or fourth voltage-dividing circuit), and such first to fourth series circuits (or first to fourth voltage-dividing circuits) are connected in parallel with one another and incorporated in the parallel LC circuit 11 as inductance elements of the self-oscillation circuit 10. Four oscillation output signals +sin OUT, −sin OUT, +cos OUT and −cos OUT of the self-oscillation circuit 10 are output from respective coil connection points (middle points or voltage-diving points) of the four series circuits.

Further, in FIG. 14(b), a level of the oscillation output signal output from the connection point of each of the series circuits can be regarded as a divided value of a voltage produced in portions of the two coils in accordance with respective inductance of the two coils, as set forth above in relation to FIG. 14(a). Thus, the individual oscillation output signals +sin OUT, −sin OUT, +cos OUT and −cos OUT can be expressed using A(θ) to D(θ) and A'(θ) to D'(θ) generally as indicated below. Namely, two variation elements of opposite phases (e.g., +sin θ sin ωt and −sin θ sin ωt) put in the denominator of the voltage-diving ratio are cancelled out, so that a variation element (e.g., +sin θ sin ωt) is left only in the numerator. Note that ω represents an angular frequency and t represents time.

$$+\sin \text{OUT} = A(\theta) / [A(\theta) + C(\theta)]$$

$$\sim = +\sin \theta \sin \omega t$$

$$-\sin \text{OUT} = C'(\theta) / [C'(\theta) + A'(\theta)]$$

$$\sim = -\sin \theta \sin \omega t$$

$$+\cos \text{OUT} = B(\theta) / [B(\theta) + D(\theta)]$$

$$\sim = +\cos \theta \sin \omega t$$

$$-\cos \text{OUT} = D'(\theta) / [D'(\theta) + B'(\theta)]$$

$$\sim = -\cos \theta \sin \omega t$$

Namely, in the illustrated example of FIG. 14(b), four oscillation output signals +sin OUT, −sin OUT, +cos OUT and −cos OUT presenting different characteristics responsive to a position θ of the detection object can be provided by use of the only one self-oscillation circuit 10. These four oscillation output signals +sin OUT, −sin OUT, +cos OUT and −cos OUT are input respectively to the four rectifier circuits 21a, 21c, 21b and 21d shown in FIG. 9. Namely, to implement the construction shown in FIG. 14(b), the one self-oscillation circuit 10 shown in FIG. 14(b) is employed in place of the four self-oscillation circuits 10a to 10d shown in FIG. 9, and the oscillation output signal +sin OUT of a plus sine amplitude characteristic of the self-oscillation circuit 10 is input to the rectifier circuit 21a, the oscillation output signal −sin OUT of a minus sine amplitude characteristic is input to the rectifier circuit 21c, the oscillation output signal +cos OUT of a plus cosine amplitude characteristic is input to the rectifier circuit 21b, and the oscillation output signal −cos OUT of a minus cosine amplitude characteristic is input to the rectifier circuit 21d. In this way, temperature-characteristic-compensated detection signals VO sin and VO cos can be provided through differential amplification arithmetic operations by the arithmetic units 25s and 25c.

Note that the oscillation output signals +sin OUT, −sin OUT, +cos OUT and −cos OUT in FIG. 14(b) can be used as-is or directly for any desired applications as AC signals containing position detection amplitude information without being applied to the circuitry of FIG. 9. Particularly, the oscillation output signals +sin OUT, −sin OUT, −cos OUT and −cos OUT are the same as four AC output signals, i.e. +sin θ sin ωt, −sin θ sin ωt, +cos θ sin ωt and −cos θ sin ωt, output from a known resolver, it is possible to provide output signals similar to output signals of a conventionally-known resolver, with an extremely simplified circuit structure. For example, as known in a position detection system of a resolver-type detection device, the four oscillation output signals +sin OUT (=+sin θ sin ωt), −sin OUT (=−sin θ sin ωt), +cos OUT (=+cos θ sin ωt) and −cos OUT (=−cos θ sin ωt) are synthesized, the position detection information θ in the amplitude element (sin θ) is converted into a phase shift element θ in an AC signal of sin(ωt−θ), and such an AC signal of sin(ωt−θ) is input to a conventionally-known R converter or phase detection circuit so that position detection data corresponding to the phase shift element θ can be provided.

FIG. 14(c) shows a modification of the self-oscillation circuit 10 shown in FIG. 14(b). In the self-oscillation circuit 10 shown in FIG. 14(c), only the respective series connection circuits of the first coils pairs 41 and 43 and 42 and 44 and the parallel connection circuit of the series connection circuits are formed, without the second coil pairs being provided, and incorporated as inductance elements. With such arrangements, the self-oscillation circuit 10 can provide an oscillation output signal +sin OUT of a plus sine amplitude characteristic and an oscillation output signal +cos OUT of a plus cosine amplitude characteristic. In the example shown in FIG. 14(c), it suffices to use only two of the four sets of detection circuitry shown in FIG. 9. Namely, the oscillation output signals +sin OUT and +cos OUT in FIG. 14(c) may be input respectively to the rectifier circuits 21a and 21b. Further, in the example shown in FIG. 14(c) as well, there can be provided the same signals as two AC output signals +sin θ sin ωt and +cos θ sin ωt output from a conventionally-known resolver. Thus, the oscillation output signals +sin OUT and +cos OUT in FIG. 14(c) can be used as-is or directly for any desired applications as AC signals containing position detection amplitude information without being applied to the circuitry of FIG. 9.

Whereas the example shown in FIG. 14(b) has been described above as including the additional circuit board, the present invention is not so limited, and any other desired construction may be employed. For example, eight coils 41 to 44 and 41' to 44' may be disposed or provided on the single circuit board 45 at equal intervals (of 45°) and the magnetism-responsive member 51 of the rotor section 50 may be formed in an elliptical disk shape so that two cycles of inductance variations occur in each of the coils 41 to 44 and 41' to 44' per rotation. In such a case too, any rotational position within a half-rotation range can be detected in an absolute value, and a rotation range more than a half rotation may be detected by a conventionally-known method, e.g. by counting the number of cycles occurring per half rotation.

As a modification of the constructions shown in FIG. 14, each of the series circuits of coils (voltage-dividing circuits) may include at least one detecting coil (4a, 4b, 41-44). For example, the construction shown in FIG. 14(a) may be modified such that the first series circuit (voltage-dividing circuit) comprises the coil 4a and fixed resistance (or fixed inductance) connected in series with each other while the second series circuit (voltage-dividing circuit) comprises the coil 4b and fixed resistance (or fixed inductance) connected in series with each other. The constructions shown in FIG. 14(b) and FIG. 14(c) may be modified similarly to the construction shown in FIG. 14(a). Such modifications may be summarized as follows. Namely, in the self-oscillation circuit (10), the inductance element for self-oscillation may comprise a voltage-dividing circuit, and the above-mentioned coil (4a, 4b, or 41-44) may be incorporated in the voltage-dividing circuit so that the oscillation output signals (+DVout and −DVout, or +sin OUT, −sin OUT, +cos OUT, −cos OUT) of the self-oscillation circuit can be output from a voltage-dividing point of the voltage-dividing circuit. Also, the coil section may include a plurality of coils (4a, 4b, or 41-44) disposed at predetermined intervals, and the self-oscillation circuit (10) may comprise a plurality of the voltage-dividing circuits connected in parallel with each other to constitute the inductance elements for self-oscillation with the coil (4a and 4b, or 41-44) incorporated in each of the voltage-dividing circuits so that a plurality of the oscillation output signals (+DVout and −DVout, or +sin OUT, −sin OUT, +cos OUT, −cos OUT) of the self-oscillation circuit can be output from a voltage-dividing point of each of the voltage-dividing circuits. Such modifications too can achieve the superior advantageous benefit that a plurality of position detection signals of different characteristics can be generated by use of only one self-oscillation circuit 10.

What is claimed is:
1. A position detection device comprising:
a coil section including at least one coil;
a target section whose relative position to the coil section varies in response to a position of a detection object, said target section including a magnetism-responsive member constructed to cause inductance of the coil included in said coil section to vary in accordance with the relative position;
a self-oscillation circuit comprising the coil included in said coil section and a capacitor, said self-oscillation circuit having the coil, included in said coil section, incorporated therein as an inductance element for self-oscillation, said self-oscillation circuit having its oscillation frequency set in a high frequency band; and
an output circuit that extracts an amplitude level of an oscillation output signal of said self-oscillation circuit and outputs the extracted amplitude level as position data of the detection object,
wherein said coil section includes at least one pair of the coils disposed at a predetermined interval from each other, said target section is constructed to cause respective inductance variations of the coils, constituting the pair, to present mutually opposite characteristics, and said self-oscillation circuit connects the two coils, constituting the pair, in series with each other and outputs the oscillation output signal of the self-oscillation circuit from a connection point between the two coils.

2. The position detection device as claimed in claim 1, wherein the oscillation frequency of said self-oscillation circuit is 1 MHz or higher.

3. The position detection device as claimed in claim 1, wherein said output circuit includes a rectifier circuit that rectifies the oscillation output signal of said self-oscillation circuit.

4. The position detection device as claimed in claim 3, wherein said output circuit further includes a circuit that not only offset-adjusts a level of an output DC signal of the rectifier circuit but also adjusts a gain of the output DC signal of the rectifier circuit.

5. The position detection device as claimed in claim 1, wherein said coil comprises a flat coil formed in a swirling shape on a printed circuit board.

6. The position detection device as claimed in claim 5, wherein said coil comprises a plurality of flat coil portions disposed in multiple layers and connected in series with one another.

7. The position detection device as claimed in claim 5, which includes a temperature-characteristic compensating circuit element provided on the printed circuit board, so that a temperature-characteristic-compensated output signal is output from said self-oscillation circuit.

8. A system comprising two position detection devices recited in claim 1, said two position detection devices being constructed in such a manner that respective position data output from the two position detection devices present differential variations responsive to a same detection object, said system providing position detection data compensated in temperature characteristic on a basis of the respective position data of the two position detection devices.

9. The position detection device as claimed in claim 1, wherein said self-oscillation circuit and said output circuit are provided individually for each of the coils constituting the pair.

10. The position detection device as claimed in claim 1, wherein the detection object moves in a rotational direction, and which is constructed as a rotational position detection device.

11. The position detection device as claimed in claim 1, wherein said coil section includes a plurality of the at least one pair of the coils, said self-oscillation circuit connects, for each of the plurality of pairs, the two coils, constituting the pair, in series with each other to provide a series circuit of the coils and connects individual ones of the series circuits of the coils, constituting the plurality of pairs, in parallel with each other, said self-oscillation circuit individually outputting oscillation output signals from respective coil connection points in the pairs, and said output circuit extracts respective amplitude levels of a plurality of the oscillation output signals output from said self-oscillation circuit and outputs the extracted amplitude levels as a plurality of position data indicative of a position of the detection object.

12. The position detection device as claimed in claim 1, wherein, in said self-oscillation circuit, the induction element for self-oscillation comprises a voltage-dividing circuit, the coil being incorporated in the voltage-dividing circuit, and
the oscillation output signal of said self-oscillation circuit is output from a voltage-dividing point of the voltage-dividing circuit.

13. The position detection device as claimed in claim 12, wherein said self-oscillation circuit constructs the inductance element for self-oscillation by connecting a plurality of the voltage-dividing circuits in parallel with each other, the coil being incorporated in each of the voltage-dividing circuits, and wherein a plurality of the oscillation output signals are output from the voltage-dividing points of individual ones of the voltage-dividing circuits.

14. The position detection device as claimed in claim 1, wherein the detection object moves in a linear direction, and which is constructed as a linear position detection device.

15. The position detection device as claimed in claim 1, wherein the detection object moves arcuately, and which is constructed as an inclination detection device.

16. A position detection device comprising:
a coil section including a plurality of pairs of coils;
a target section whose relative position to the coil section varies depending on a position of a detection object, said target section including a magnetism-responsive member constructed to cause to vary respective inductance of the coils included in said coil section in accordance with the relative position;
a self-oscillation circuit comprising the coils included in said coil section and capacitors, said self-oscillation circuit forming a plurality of series circuits by connecting, for each of the pairs, two coils, constituting the pair, in series with each other to thereby provide a plurality of series circuits and connecting the series circuits in parallel with each other, said self-oscillation circuit having the series circuits, connected in parallel, incorporated therein as an inductance element for self-oscillation,
wherein a plurality of oscillation output signals are taken out from respective connection points of said pairs of coils being output as a plurality of position detection signals of different characteristics.

17. The position detection device as claimed in claim 16, wherein the plurality of oscillation output signals include four oscillation output signals having characteristics of +sin θ sin ωt, −sin θ sin ωt, +cos θ sin ωt and −cos θ sin ωt responsive to a position θ of a detection object, where ω represents an angular frequency of self-oscillation.

18. The position detection device as claimed in claim 16, wherein each of the plurality of series circuits is constructed in such a manner that the two coils connected in series with each other present inductance variations of mutually opposite characteristics.

19. The position detection device as claimed in claim 18, wherein a first oscillation output signal taken out from the coil connection point of a first series circuit of the plurality of series circuits and a second oscillation output signal taken out from the coil connection point of a second series circuit of the plurality of series present mutually opposite characteristics responsive to a position of a detection object.

20. A position detection device comprising:
a coil section including a plurality of coils;
a target section whose relative position to the coil section varies in response to a position of a detection object, said target section including a magnetism-responsive member constructed to cause respective inductance of the coils included in said coil section to vary in accordance with the relative position, said target section being constructed in such a manner that a variation characteristic of the inductance responsive to the position of the detection object differs between at least two or more of the coils; and
a plurality of self-oscillation circuits comprising the coils included in said coil section and capacitors, each of the self-oscillation circuits having at least one of the plurality of coils, included in said coil section, incorporated therein as an inductance element for self-oscillation, wherein said self-oscillation circuit connects the two coils, constituting the pair, in series with each other and outputs the oscillation output signal of the self-oscillation circuit from a connection point between the two coils, and wherein the plurality of self-oscillation circuits provide a plurality of position detection signals of different characteristics being output on a basis of a plurality of oscillation output signals of the plurality of self-oscillation circuits.

* * * * *